US011837276B2

(12) United States Patent
Takahashi et al.

(10) Patent No.: US 11,837,276 B2
(45) Date of Patent: Dec. 5, 2023

(54) APPARATUSES AND METHODS FOR 1T AND 2T MEMORY CELL ARCHITECTURES

(71) Applicant: MICRON TECHNOLOGY, INC., Boise, ID (US)

(72) Inventors: Hiroki Takahashi, Tokyo (JP); Toru Ishikawa, Kanagawa (JP)

(73) Assignee: Micron Technology, Inc., Boise, ID (US)

( * ) Notice: Subject to any disclaimer, the term of this patent is extended or adjusted under 35 U.S.C. 154(b) by 86 days.

(21) Appl. No.: 17/551,095

(22) Filed: Dec. 14, 2021

(65) Prior Publication Data

US 2023/0186971 A1    Jun. 15, 2023

(51) Int. Cl.
*G11C 11/4091*    (2006.01)
*G11C 11/406*    (2006.01)

(52) U.S. Cl.
CPC ........ *G11C 11/4091* (2013.01); *G11C 11/406* (2013.01)

(58) Field of Classification Search
CPC .......................... G11C 11/4091; G11C 11/406
See application file for complete search history.

(56) References Cited

U.S. PATENT DOCUMENTS

| | | | | |
|---|---|---|---|---|
| 6,314,014 | B1 * | 11/2001 | Lowrey | G11C 11/5678 |
| | | | | 365/100 |
| 7,339,815 | B2 * | 3/2008 | Wicker | G11C 11/56 |
| | | | | 365/189.09 |
| 2023/0030605 | A1 * | 2/2023 | Lee | G11C 11/4097 |

* cited by examiner

*Primary Examiner* — Min Huang
(74) *Attorney, Agent, or Firm* — Dorsey & Whitney LLP

(57) ABSTRACT

Apparatuses and methods for 1T and 2T memory cell architectures. A memory array includes a word line which has both 1T and 2T portions. In the 1T portion, each sense amplifier is coupled to one memory cell along the word line. In the 2T portion, sense amplifiers are coupled to more than one memory cell along the word line each. For example, each sense amplifier in the 2T portion may be coupled to two bit lines, each of which intersect a memory cell along the word line. In some embodiments, the 2T portion may store a count value which represents an access count to the word line.

18 Claims, 10 Drawing Sheets

APPARATUSES AND METHODS FOR 1T AND 2T MEMORY CELL ARCHITECTURES

BACKGROUND

Information may be stored on memory cells of a memory device. The memory cells may be organized at the intersection of word lines (rows) and bit lines (columns). During an access operation, a word line may be activated and data may be read out from the memory cells along the bit lines to sense amplifiers, which may detect the information stored in the memory cells. In some applications, it may be useful to alter the timing with which certain memory cells along the word line operate.

DETAILED DESCRIPTION

Figure 1:
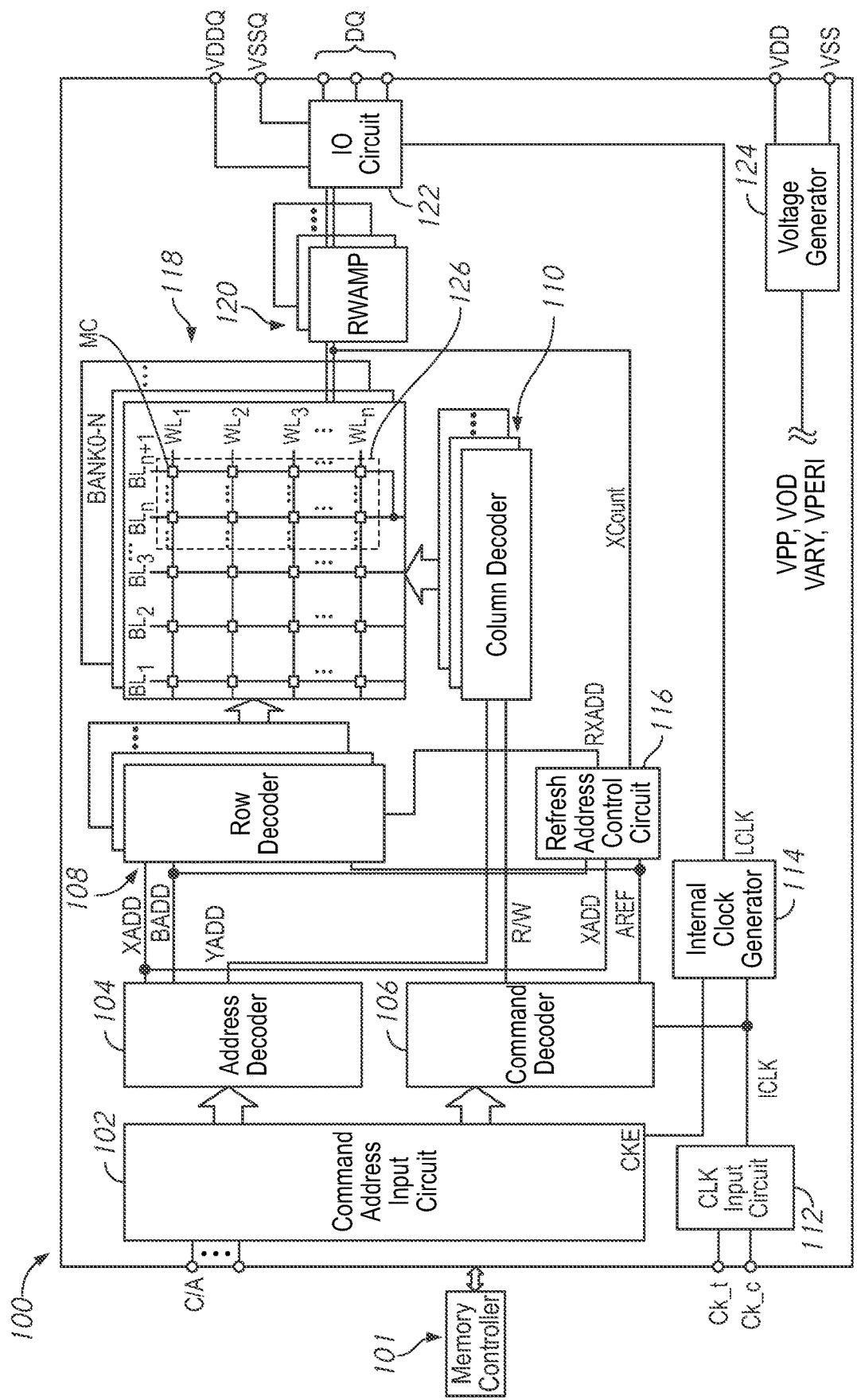
FIG. 1 is a block diagram of a semiconductor device according to an embodiment of the present disclosure.

The following description of certain embodiments is merely exemplary in nature and is in no way intended to limit the scope of the disclosure or its applications or uses. In the following detailed description of embodiments of the present systems and methods, reference is made to the accompanying drawings which form a part hereof, and which are shown by way of illustration specific embodiments in which the described systems and methods may be practiced. These embodiments are described in sufficient detail to enable those skilled in the art to practice presently disclosed systems and methods, and it is to be understood that other embodiments may be utilized and that structural and logical changes may be made without departing from the spirit and scope of the disclosure. Moreover, for the purpose of clarity, detailed descriptions of certain features will not be discussed when they would be apparent to those with skill in the art so as not to obscure the description of embodiments of the disclosure. The following detailed description is therefore not to be taken in a limiting sense, and the scope of the disclosure is defined only by the appended claims.

Information in a memory array may be accessed by one or more access operations, such as read or write operations. During a read operation, a word line is activated, and data is read out from the memory cells along that word line along the bit lines coupled to those respective memory cells. Sense amplifiers coupled to the bit lines detect if the voltage along the bit line represents a logical high or logical low, and drives the voltage along the bit line to an appropriate voltage level. One or more bit lines can then be coupled to respective input/output (I/O) lines to read out the voltage on the bit line. Similarly, during a write operation, bit lines may be coupled to I/O lines and the sense amplifiers may provide that data along the bit lines to be written to the memory cells. It takes time for the memory to access the memory cells along a given word line. In some applications, it may be useful for different memory cells to have different access speeds. One of the limiting factors which determines access speed may be the time it takes to sense the relatively small voltages produced by the charge stored in a single memory cell.

The present disclosure is drawn to apparatuses, systems, and methods for 1T and 2T memory cell architectures. A given word line may have a number of memory cells along it, including a first portion of memory cells and a second portion of memory cells. Along the first portion, each memory cell may be coupled to a separate sense amplifier along a respective bit line, which may be referred to as a 1T architecture. In the second portion, each sense amplifier is coupled to more than one memory cell (e.g., each sense amplifier may have two bit lines shorted together coupled to it), which may be referred to as a 2T architecture. The 2T may have increased access speed compared to the 1T architecture, since the two memory cells both store the same logical value and therefore both contribute charge to the voltage read by the sense amplifier.

An example application that may use such an architecture is a memory in which an access count associates with each row is stored in memory cells of that row. Repeated accesses to a word line of the memory (e.g., a "row hammer" attack) may cause an increased rate of memory degradation in the memory cells of nearby word lines. To mitigate this, the memory may store an access count associated with each row along designated counter memory cells along that row. Since those counter memory cells must undergo a read-modify-write cycle with each access operation (e.g., to read the count, update it, and then write the updated count back to the counter memory cells), it may be useful for those counter memory cells operate with faster timing than the memory cells of the rest of the word line. Accordingly, the counter memory cells may use a 2T architecture, while the rest of the memory cells along the word line may use a 1T architecture.

While the term 2T is used herein, and while embodiments may be described with respect to arrangements were two memory cells are coupled together to store the same bit, it should be understood that in other embodiments, more than two memory cells may be coupled together in the 2T region. For example, in some embodiments, there may be three memory cells each of which have their bit lines shorted together.

FIG. 1 is a block diagram of a semiconductor device according to at least one embodiment of the disclosure. The semiconductor device 100 may be a semiconductor memory device, such as a DRAM device integrated on a single semiconductor chip.

The semiconductor device 100 includes a memory array 118. The memory array 118 is shown as including a plurality of memory banks. In the embodiment of FIG. 1, the memory array 118 is shown as including eight memory banks BANK0-BANK7. More or fewer banks may be included in the memory array 118 of other embodiments. Each memory bank includes a plurality of word lines WL (rows), a plurality of bit lines BL (columns), and a plurality of memory cells MC arranged at intersections of the plurality of word lines WL and the plurality of bit lines BL. Some of the memory cells MC along the wordlines may be 2T memory cells 126. The 2T memory cells 126 may be similar to the other memory cells (e.g., 1T memory cells) of the memory array 118, except that the 2T memory cells 126 are organized that pairs of memory cells are coupled together to store the same bit. For example, the two memory cells in the 2T region 126 may have bit lines which are shorted together. Other arrangements of linking memory cells in the 2T region 126 may be used in other example embodiments. Example arrangements of the 2T region 126 are described herein, for example in FIGS. 4-8.

The memory device 100 may use the 2T region 126 to store a count value XCount associated a number of accesses to the word line. For example, the memory cells along the 2T region 126 may be used to store bits of a number, XCount, and the memory cells along the 2T region 126 may be counter memory cells. For example, if the number XCount is an N bit binary number, then there may be 2N memory cells along the 2T region 126, shorted together to store N bits. A data bus associated with the 2T memory region 126 may be coupled to the refresh address control circuit 116. In some embodiments, the data bus associated with the counter memory cells 126 may be separate from the data bus which couples the other memory cells to the IO circuit 122.

The selection of the word line WL is performed by a row decoder 108 and the selection of the bit lines BL is performed by a column decoder 110. In the embodiment of FIG. 1, the row decoder 108 includes a respective row decoder for each memory bank and the column decoder 110 includes a respective column decoder for each memory bank. The bit lines BL are coupled to a respective sense amplifier (SAMP). Read data from the bit line BL is amplified by the sense amplifier SAMP, and transferred to read/write amplifiers 120 over complementary local data lines (LIOT/B), transfer gate (TG), and complementary main data lines (MIOT/B). Conversely, write data outputted from the read/write amplifiers 120 is transferred to the sense amplifier SAMP over the complementary main data lines MIOT/B, the transfer gate TG, and the complementary local data lines LIOT/B, and written in the memory cell MC coupled to the bit line BL. Information may generally be read from and written to the 2T memory cells 126 in an analogous fashion. In embodiments, where the 2T memory cells store a count value XCount, the data in the 2T memory cells 126 are read and written by the refresh address control circuit 116.

The semiconductor device 100 may employ a plurality of external terminals that include command and address (C/A) terminals coupled to a command and address bus to receive commands and addresses, and a CS signal, clock terminals to receive clocks CK and /CK, data terminals DQ to provide data, and power supply terminals to receive power supply potentials VDD, VSS, VDDQ, and VSSQ.

The clock terminals are supplied with external clocks CK and /CK that are provided to an input circuit 112. The external clocks may be complementary. The input circuit 112 generates an internal clock ICLK based on the CK and /CK clocks. The ICLK clock is provided to the command decoder 110 and to an internal clock generator 114. The internal clock generator 114 provides various internal clocks LCLK based on the ICLK clock. The LCLK clocks may be used for timing operation of various internal circuits. The internal data clocks LCLK are provided to the input/output circuit 122 to time operation of circuits included in the input/output circuit 122, for example, to data receivers to time the receipt of write data.

The C/A terminals may be supplied with memory addresses. The memory addresses supplied to the C/A terminals are transferred, via a command/address input circuit 102, to an address decoder 104. The address decoder 104 receives the address and supplies a decoded row address XADD to the row decoder 108 and supplies a decoded column address YADD to the column decoder 110. The address decoder 104 may also supply a decoded bank address BADD, which may indicate the bank of the memory array 118 containing the decoded row address XADD and column address YADD. The C/A terminals may be supplied with commands. Examples of commands include timing commands for controlling the timing of various operations, access commands for accessing the memory, such as read commands for performing read operations and write commands for performing write operations, as well as other commands and operations. The access commands may be associated with one or more row address XADD, column address YADD, and bank address BADD to indicate the memory cell(s) to be accessed.

The commands may be provided as internal command signals to a command decoder 106 via the command/address input circuit 102. The command decoder 106 includes circuits to decode the internal command signals to generate various internal signals and commands for performing operations. For example, the command decoder 106 may provide a row command signal to select a word line and a column command signal to select a bit line.

The device 100 may receive an access command which is a row activation command ACT. When the row activation command ACT is received, a bank address BADD and a row address XADD are timely supplied with the row activation command ACT.

The device 100 may receive an access command which is a read command. When a read command is received, a bank address BADD and a column address YADD are timely supplied with the read command, read data is read from memory cells in the memory array 118 corresponding to the row address XADD and column address YADD. The read command is received by the command decoder 106, which provides internal commands so that read data from the memory array 118 is provided to the read/write amplifiers 120. The read data is output to outside from the data terminals DQ via the input/output circuit 122. The access count XCount stored in the 2T memory cells 126 of the row associated with the row address XADD are read to the refresh address control circuit 116, and an updated value of the access count XCount' is written back to the 2T memory cells 126 of the row XADD.

The device 100 may receive an access command which is a write command. When the write command is received, a bank address BADD and a column address YADD are timely supplied with the write command, write data supplied to the data terminals DQ is written to a memory cells in the memory array 118 corresponding to the row address and column address. The write command is received by the command decoder 106, which provides internal commands so that the write data is received by data receivers in the input/output circuit 122. Write clocks may also be provided to the external clock terminals for timing the receipt of the write data by the data receivers of the input/output circuit 122. The write data is supplied via the input/output circuit 122 to the read/write amplifiers 120, and by the read/write amplifiers 120 to the memory array 118 to be written into the memory cell MC. Similar to the read operation described above, the access count Xcount stored in the 2T memory cells 126 of the row associated with the row address XADD are read to the refresh address control circuit 116, and an updated value of the access count Xcount' is written back to the 2T memory cells 126 of the row XADD.

The device 100 may also receive commands causing it to carry out an auto-refresh operation. The refresh signal AREF may be a pulse signal which is activated when the command decoder 106 receives a signal which indicates an auto-refresh command. In some embodiments, the auto-refresh command may be externally issued to the memory device 100. In some embodiments, the auto-refresh command may be periodically generated by a component of the device. In some embodiments, when an external signal indicates a self-refresh entry command, the refresh signal AREF may also be activated. The refresh signal AREF may be activated once immediately after command input, and thereafter may be cyclically activated at desired internal timing. Thus, refresh operations may continue automatically. A self-refresh exit command may cause the automatic activation of the refresh signal AREF to stop and return to an IDLE state.

The refresh signal AREF is supplied to the refresh address control circuit 116. The refresh address control circuit 116 supplies a refresh row address RXADD to the row decoder 108, which may refresh a wordline WL indicated by the refresh row address RXADD. The refresh address control circuit 116 may control a timing of the refresh operation, and may generate and provide the refresh address RXADD. The refresh address control circuit 116 may be controlled to change details of the refreshing address RXADD (e.g., how the refresh address is calculated, the timing of the refresh addresses), or may operate based on internal logic.

The refresh address control circuit 116 may selectively output a targeted refresh address (e.g., a victim address) or an automatic refresh address (auto-refresh address) as the refreshing address RXADD. The automatic refresh addresses may be a sequence of addresses which are provided based on activations of the auto-refresh signal AREF. The refresh address control circuit 116 may cycle through the sequence of auto-refresh addresses at a rate determined by AREF. In some embodiments, the sequence of auto-refresh addresses may include all the addresses in the memory bank 118. In some embodiments, the auto-refresh signal AREF may be issued with a frequency such that most or all of the addresses in the memory bank 118 are refreshed within a certain period, which may be based on an expected rate at which information in the memory cells MC decays.

The refresh address control circuit 116 may also determine targeted refresh addresses which are addresses that require refreshing (e.g., victim addresses corresponding to victim rows) based on the access pattern of nearby addresses (e.g., aggressor addresses associated with aggressor rows) in the memory array 118. The refresh address control circuit 116 may monitor accesses to the different wordlines WL of the memory bank. When the row decoder 108 sends an access command to a particular row, the 2T memory cells 126 along that row may have their information read to the refresh address control circuit 116 as the access count Xcount. The refresh address control circuit 116 may determine an access count of the row based on the values stored in the 2T memory cells 126 of the accessed row.

The refresh address control circuit 116 may determine if the accessed row is an aggressor row based on the access count from the 2T memory cells 126. If the current row is not an aggressor row, the value of the access count may be changed and then the refresh address control circuit may write the new value of the access count back to the counter memory cells 126 of the accessed row. If the refresh address control circuit 116 determines that the accessed row is an aggressor, then the refresh address control circuit 116 may use the row address XADD of the accessed row to determine one or more victim row addresses and provide them as a refresh address RXADD as part of a targeted refresh operation. When the accessed row is determined to be an aggressor, the access count Xcount associated with that row may be reset (e.g., to a minimum value, such as 0). In some embodiments, the refresh address control circuit 116 may queue up identified aggressor addresses (e.g., in a register) for later use in targeted refresh operations.

The refresh address RXADD may be provided with a timing based on a timing of the refresh signal AREF. The refresh address control circuit 116 may have time slots corresponding to the timing of AREF, and may provide one or more refresh addresses RXADD during each time slot. In some embodiments, the targeted refresh address may be issued in (e.g., "steal") a time slot which would otherwise have been assigned to an auto-refresh address. In some embodiments, certain time slots may be reserved for targeted refresh addresses, and the refresh address control circuit 116 may determine whether to provide a targeted refresh address, not provide an address during that time slot, or provide an auto-refresh address instead during the time slot.

The targeted refresh address may be based on access characteristics over time of the row addresses XADD received from the address decoder 104. For example, the access characteristics may be determined based on the value of the access count Xcount stored in the 2T memory cells 126. The refresh address control circuit 116 may use different methods to calculate a targeted refresh address based on a row address XADD identified as an aggressor address based on the access count. For example, the refresh address control circuit 116 may determine if a given row is an aggressor address, and then calculate and provide addresses corresponding to victim addresses of the aggressor address as the targeted refresh address. In some embodiments, more than one victim address may correspond to a given aggressor address. In this case the refresh address control circuit may queue up multiple targeted refresh addresses, and provide them sequentially when it determines that a targeted refresh address should be provided. The refresh address control circuit 116 may provide the targeted refresh address right away, or may queue up the targeted refresh address to be provided at a later time (e.g., in the next time slot available for a targeted refresh).

The power supply terminals are supplied with power supply potentials VDD and VSS. The power supply potentials VDD and VSS are supplied to an internal voltage generator circuit 124. The internal voltage generator circuit 124 generates various internal potentials VPP, VOD, VARY, VPERI, and the like based on the power supply potentials VDD and VSS supplied to the power supply terminals. The internal potential VPP is mainly used in the row decoder 108, the internal potentials VOD and VARY are mainly used in the sense amplifiers SAMP included in the memory array 118, and the internal potential VPERI is used in many peripheral circuit blocks.

The power supply terminals are also supplied with power supply potentials VDDQ and VSSQ. The power supply potentials VDDQ and VSSQ are supplied to the input/output circuit 122. The power supply potentials VDDQ and VSSQ supplied to the power supply terminals may be the same potentials as the power supply potentials VDD and VSS supplied to the power supply terminals in an embodiment of the disclosure. The power supply potentials VDDQ and VSSQ supplied to the power supply terminals may be different potentials from the power supply potentials VDD and VSS supplied to the power supply terminals in another embodiment of the disclosure. The power supply potentials VDDQ and VSSQ supplied to the power supply terminals are used for the input/output circuit 122 so that power supply noise generated by the input/output circuit 122 does not propagate to the other circuit blocks.

Figure 2:
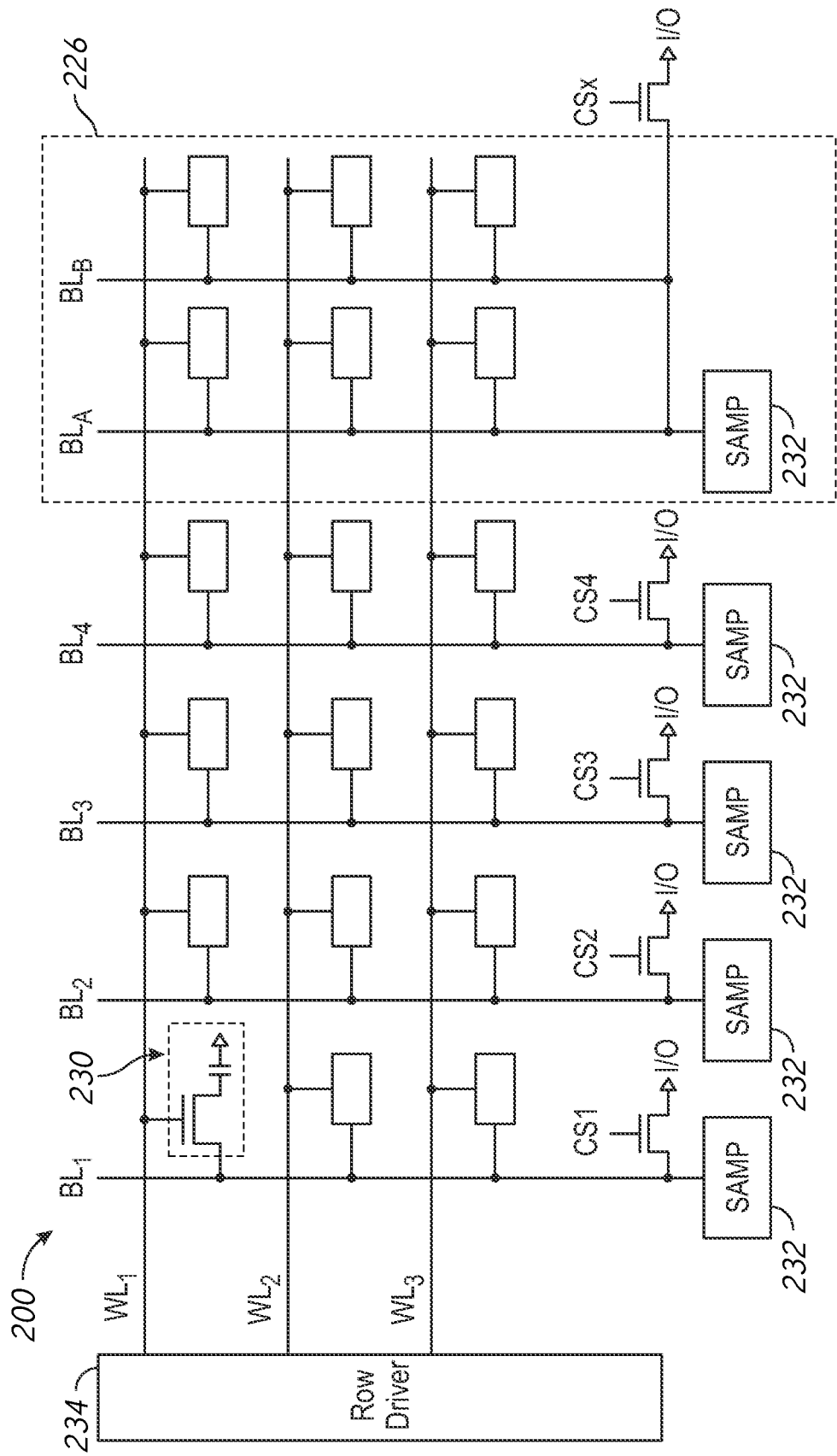
FIG. 2 is a block diagram of a memory cell array according to an embodiment of the present disclosure.

FIG. 2 is a block diagram of a memory cell array according to an embodiment of the present disclosure. The memory cell array 200 may represent an exemplary portion of a memory array, such as the memory array 118 of FIG. 1. The memory cell array 200 includes a plurality of word lines WL (rows) and bit lines BL (columns). A row driver 234 is coupled to the rows. A plurality of memory cells MC, such as example memory cell 230, are located at the intersection of the rows and columns. A portion of the memory cells along a given word line may be set up using a 2T architecture, such as in 2T region 226, while a remainder of the memory cells along the word line use a 1T architecture. The memory array 200 includes a number of sense amplifiers 232 and 233. The sense amplifiers 232 and 233 may be generally similar to each other, except that the sense amplifiers 232 are coupled to bit lines in the 1T region, and the sense amplifiers 233 are coupled to bit lines in the 2T region 226.

Each of the memory cells MC may store information. In some embodiments, the information may be stored as a binary code, and each memory cell MC in the 1T region may store a bit, while each pair of memory cells MC in the 2T region 226 may store a bit, which may be either at a logical high or a logical low level. Example memory cell 230 shows a particular implementation which may be used to store a bit of information in some embodiments. Other types of memory cells may be used in other examples. In the example memory cell 230, a capacitive element stores the bit of information as a charge. A first charge level may represent a logical high level, while a second charge level may represent a logical low level. One node of the capacitive element is coupled to a reference voltage (e.g., VSS). The other node of the capacitive element is coupled to a switch. In the example memory cell 230, the switch is implemented using a transistor. A sense node of the switch (e.g., the gate of the transistor) is coupled to the wordline. The wordline WL may be accessed by the row driver 234 setting a voltage along the wordline such that the switches in the memory cells MC are closed, coupling the capacitive elements (or other bit storage element) to the associated bitlines BL.

The sense amplifiers 232 and 233 may read or write a value of a bit of information along the bitline BL (or in the 2T region 226, bitlines) to memory cell MC (or memory cells) at the accessed wordline WL. The sense amplifiers 232/233 may convert a signal along the bit line to a signal which is 'readable' by other elements of the memory device (e.g., by amplifying a voltage). The bit lines may be coupled to an input/output circuit (e.g., input/output circuit 122 of FIG. 1) via a respective column select switch, which may be a column select transistor activated by a column select signal CS. In the example view of FIG. 2, six bit lines are shown, four "normal" bits lines, each accessed by a respective column select signal CS1 to CS4, and two bit lines in a 2T region 226, which are accessed by a single column select signal CSx. Accordingly, each word line of FIG. 2 stores 5 total bits. It should be understood that FIG. 2 is a simplified view, and that many more (or fewer) memory cells, and/or a different ratio of normal memory cells to 2T memory cells, may be used.

In an example read operation, when a wordline WL is accessed, the memory cells MC may provide their charge onto the coupled bitlines BL which may cause a change in a voltage and/or current along the bitline BL. The sense amplifier 232 may determine a logical level of the accessed memory cell MC based on the resulting voltage and/or current along the bitline BL, and may provide a signal corresponding to the logical level through the column select transistor to the input/output circuit.

In an example write operation, the sense amplifiers 232 may receive a signal indicating a logical level to be written to the accessed memory cells from the input/output circuit. The sense amplifier 232 may provide a voltage and/or current along the coupled bitline BL (e.g., along the bitlines with active column select transistors) at a level corresponding to the logical level to be written. The voltage and/or current along the bitline BL may charge the capacitive element at the intersection of the bitline with an accessed wordline to a charge level associated with the written logical level. In this manner, by specifying the row which is accessed, and which bitlines to record data from (and/or write data to), specific memory cells MC may be accessed during one or more operations of the memory device.

During an example refresh operation (either targeted or auto-refresh), the wordline WL to be refreshed may be read, and then logical value read from each of the memory cells along that may be written back to the same memory cells. In this manner the level of charge in the refreshed memory cells MC may be restored to the full value associated with the logical level stored in that memory cell.

Certain memory cells along each of the wordlines may be set up as 2T memory cells 226. The 2T memory cells 226 may generally be similar to the other, 1T, memory cells of the memory array 200. In some embodiments, the 2T memory cells 226 may be physically the same as the other memory cells MC. However, rather than each sense amplifier 232 being coupled to a single memory cell, in the 2T region, each sense amplifier 233 is coupled to multiple memory cells (e.g., a pair of memory cells). For example, the bit lines $BL_A$ and $BL_B$ in the 2T region may be shorted together and coupled to a single sense amplifier 233.

In some embodiments, the 2T memory cells 226 may be organized along particular bitlines of the memory array 200 and particular sense amplifiers. Thus, the memory may control access to the 2T region based on which bit lines and sense amplifiers are accessed. Similarly, the timing of accesses to the 2T region 226 may be controlled by the control signals issued to the bitlines (e.g., BlA and BLB) and sense amplifiers 233 of the 2T region. In some embodiments, the 2T memory cells 226 may be positioned along an end of the memory array 200. For example, if there are some number n of 2T memory cells 226 along each wordline, the 2T memory cells 226 may be the first n memory cells of the wordline, or the last n memory cells of the wordline.

For clarity of illustration, only a few wordlines WL and bitlines BL (and their corresponding memory cells MC) are shown in FIG. 2. More wordlines WL and bitlines BL may be provided in a memory array of the present disclosure. Similarly, FIG. 2 only shows a single pair of 2T bitlines of counter memory cells 226. However, each wordline WL may have a number of 2T memory cells 226. For example, there may be 16 or 32 2T memory cells (e.g., to store 8 or 16 bits) along each word line. More or fewer 2T memory cells may be used in other embodiments. In some embodiments, the 2T memory cells 226 may be located together in a contiguous region. In some embodiments, the 2T memory cells 226 may be distributed along the word line, and 1T memory cells may be positioned between sets of 2T memory cells.

Figure 3:
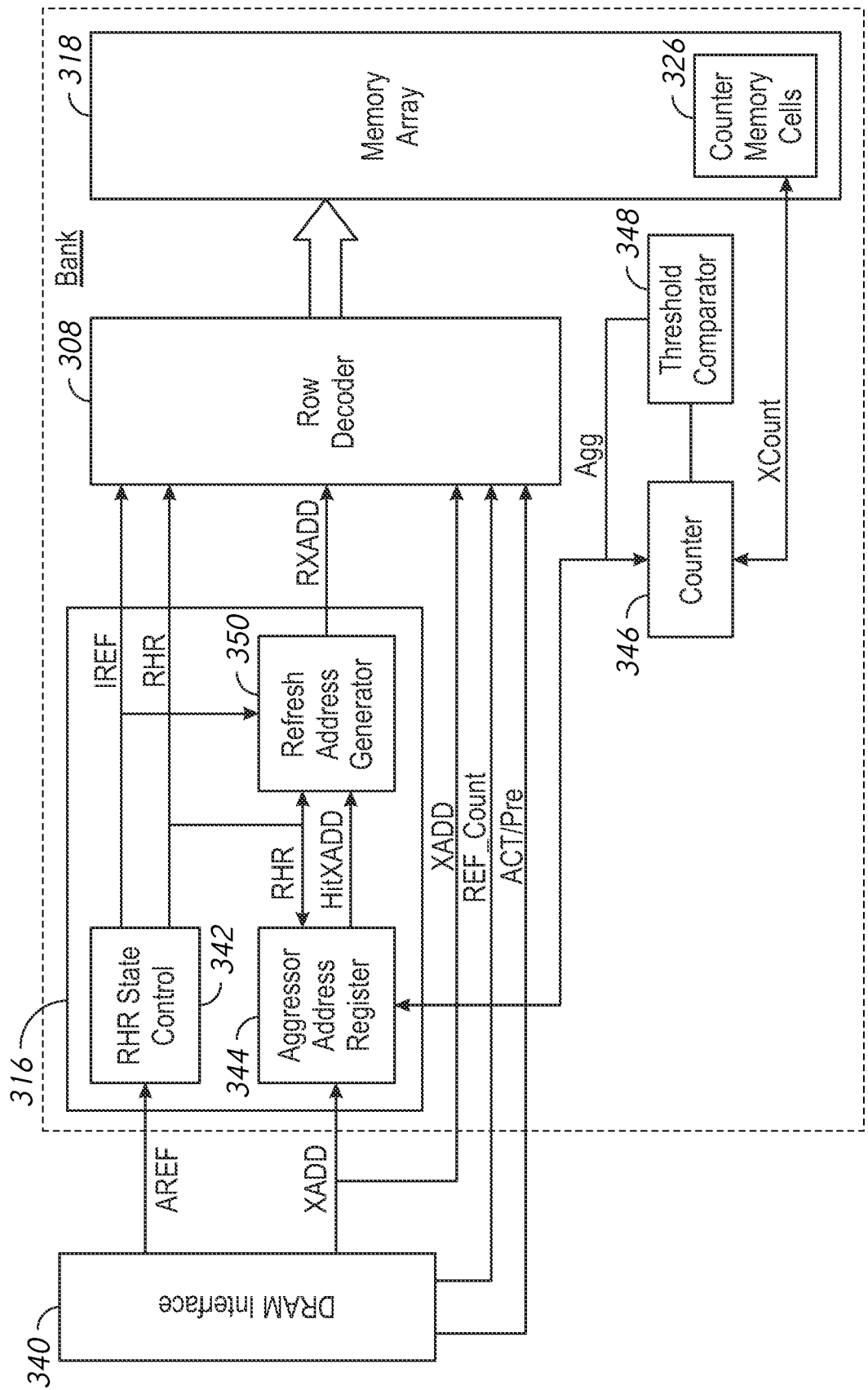
FIG. 3 is a block diagram of a refresh address control circuit according to an embodiment of the present disclosure.

FIG. 3 is a block diagram of a refresh address control circuit according to an embodiment of the present disclosure. FIG. 3 represents an example embodiment of how a memory may utilize word lines which include both 1T and 2T memory cells. In particular, in the embodiment of FIG. 3, the 2T memory cells are used as counter memory cells 326 to store a count value associated with a number of accesses to that word line. FIG. 3 represents only one example application, and 2T memory cells may be used for other purposes in other example embodiments.

In some embodiments, the refresh address control circuit 316 may be used to implement the refresh address control circuit 116 of FIG. 1. Certain internal components and signals of the refresh address control circuit 316 are shown to illustrate the operation of the refresh address control circuit 316. The dotted line around the refresh address control circuit 316, the row decoder 308, and the memory array 318 is shown to represent that in certain embodiments, each of the components within the dotted line may correspond to a particular bank of memory, and that these components may be repeated for each of the banks of memory. In some embodiments, the components shown within the dotted line may be associated with each of the memory banks. Thus, there may be multiple refresh address control circuits 316 and row decoders 308. For the sake of brevity, components for only a single bank will be described.

A DRAM interface 340 may provide one or more signals to an address refresh control circuit 316 and row decoder 308 which in turn (along with a column decoder, not shown) may perform access operation on a memory array 318. The refresh address control circuit 316 may include an RHR state control 342, an aggressor address register 344, a refresh address generator 350, a counter 346, and a threshold comparator 348. The counter 346 may be coupled to counter memory cells 326 in the memory array 318.

When a row of the memory array 318 is accessed, the values of the counter memory cells 326 along that row are read to the counter 346. For example, several 2T memory cells may store the bits of a binary number that represents the count value. For example, if the number is a 16-bit number, then 32 2T memory cells may store the value.

The counter 346 may determine a value of the access count for that row based on the values read from the counter memory cells 326. The counter 346 may be a count control circuit, which may manage a value of the count stored in the counter memory cells 326 (e.g., by reading the raw data in the counter memory cells 326 as a numerical value, writing new numerical values to the counter memory cells 326 etc.). The counter 346 may provide the count value to a threshold comparator 348, which may determine if the value of the count exceeds a threshold (e.g., if the value is greater than the threshold). If the value does not exceed the threshold (e.g., if the value is less than or equal to the threshold), then the counter may increment a value of the count and write the incremented count back to the counter memory cells 326. If the value does exceed the threshold, then the current address XADD may be determined to be an aggressor address. If the current address XADD is an aggressor address, a signal Agg may be provided to the aggressor address register 344, which may record (e.g., latch) the current value of the row address XADD. If the value of the count exceeds the threshold, then the counter 346 may reset a value of the count by writing an initial value of the count (e.g., 0) back to the counter memory cells 326.

The RHR state controller 342 may provide the signal RHR to indicate that a targeted refresh operation, such as a row hammer refresh (e.g., a refresh of the victim rows corresponding to an identified aggressor row) should occur. The RHR state controller 342 may also provide an internal refresh signal IREF, to indicate that an auto-refresh operation should occur. Responsive to an activation of RHR, the aggressor address register 344 may provide an aggressor address HitXADD, and the refresh address generator 350 may provide a refresh address RXADD, which may be one or more victim addresses associated with HitXADD. Responsive to IREF, the refresh address generator 350 may provide an auto-refresh address as the refresh address RXADD. The row decoder 308 may perform a refresh operation responsive to the refresh address RXADD and the row hammer refresh signal RHR. The row decoder 308 may perform an auto-refresh operation based on the refresh address RXADD and the internal refresh signal IREF.

The DRAM interface 340 may represent one or more components which provides signals to components of the bank. In some embodiments, the DRAM interface 340 may represent a memory controller coupled to the semiconductor memory device (e.g., device 100 of FIG. 1). In some embodiments, the DRAM interface 340 may represent components such as the command address input circuit 102, the address decoder 104, and/or the command decoder 106 of FIG. 1. The DRAM interface 340 may provide a row address XADD, the auto-refresh signal AREF, an activation signal ACT, and a precharge signal Pre. The auto-refresh signal AREF may be a periodic signal which may indicate when an auto-refresh operation is to occur. The activation signal ACT may be provided to activate a given bank of the memory. The precharge signal Pre may be provided to precharge the given bank of the memory. The row address XADD may be a signal which specifies one or more particular wordlines of the memory array 318, and may be a signal including multiple bits (which may be transmitted in series or in parallel).

The counter 346 and threshold comparator 348 may work together to determine if the access count for the row associated with the current row address XADD exceeds a threshold. When a given wordline is accessed, the value stored in each of the counter memory cells 326 along that wordline are read to the counter 346, which interprets the values of the counter memory cells 326 as an access count XCount. The counter 346 may interpret the memory cells 326 by determining a value of the access count XCount based on the bits stored in the counter memory cells 326. The threshold comparator 348 may compare the value of the access count XCount to a threshold value. In some embodiments, the value of the threshold may be a programmable value. The threshold comparator 348 may provide the signal Agg if the value of the count exceeds the value of the threshold. If the value of the count does not exceed the threshold, the counter 346 increments the value of the count, and writes the incremented value back to the counter memory cells 326. If the value of the count does exceed the threshold, the counter 346 may reset the value of the access count back to a minimum value and write the reset value back to the counter memory cells 326.

In some embodiments, the counter 346 may also increment the value of the access count if the accessed row remains activated for a certain period of time. The counter 346 may be coupled to a timer (e.g., an oscillator) which may periodically activate a timing signal. After incrementing the value of the access count when the row is accessed, the counter 346 may increment the access count again each time the timing signal activates. In some embodiments, each time the timing signal activates, the value of the access count may be compared to the threshold again. In an example timing, the counter 346 may increment an accessed row every 100-200 ns that it remains accessed. Other timings may be used in other examples. In the embodiment with a timer, additional logic may be used by the refresh address control circuit 316 to monitor activations of the memory array 318, to prevent information from being lost (e.g., the refresh address control circuit 316 may ensure that there is enough time to increment the value of the access count before updating the value).

In some embodiments, the counter 346 may directly determine if the value of the access count exceeds a threshold, and the threshold comparator 348 may be omitted. For example, the counter may have a maximum value, and when it increments after reaching the maximum value, the counter 346 may "roll over" back to a minimum value. The counter 346 may provide the signal Agg responsive to rolling over. In addition, since the value of the counter resets to the minimum value, the rolled over value of the counter may be written back to the counter memory cells 326 to reset them after the signal Agg flags the accessed row as an aggressor address.

In some embodiments, the counter 346 and the threshold comparator 348 may be physically close to the memory array 318, such that the counter bus XCount is relatively short compared to other buses into and out of the memory array 318. When either the comparator 348 or the counter 346 determines that value of XCount exceeds the threshold, the signal Agg may be sent to the aggressor address register 344 (and/or other components of the address refresh control circuit 316). In some embodiments, the counter 346 and the comparator 348 may be closer to the memory array 318 than the other components of the refresh address control circuit 316 (e.g., the RHR state control 342, the aggressor address register 344, and/or the refresh address generator 350). In some embodiments, the counter 346 and the threshold comparator 348 may be circuits which are local to the memory array 318, while the other components of the refresh address control circuit 316 may be bank level circuits. In some embodiments, only the signal Agg needs to run to the bank level circuits, which may reduce an area and power required for the XCount bus.

The aggressor address register 344 may store one or more row addresses which have been identified as aggressor addresses based on their access counts. Responsive to the command signal Agg from the threshold comparator 348, the aggressor address register 344 may store the current row address XADD which is being accessed. The aggressor address register 344 may provide the stored address as a match address HitXADD to the refresh address generator 350, which may calculate one or more victim addresses associated with the match address HitXADD. In some embodiments, the aggressor address register 344 may be a latch circuit which stores a single address. In some embodiments, the aggressor address register 344 may be a buffer which stores multiple addresses, and provides the first stored address as the match address HitXADD. The aggressor address register 344 may switch to a next address in the register after the victim row(s) associated with the first address have been refreshed.

The RHR state controller 342 may receive the auto-refresh signal AREF and provide the row hammer refresh signal RHR. The auto-refresh signal AREF may be periodically generated and may be used to control the timing of refresh operations. The memory device may carry out a sequence of auto-refresh operations in order to periodically refresh the rows of the memory device. The RHR signal may be generated in order to indicate that the device should refresh a particular targeted row (e.g., a victim row) instead of an address from the sequence of auto-refresh addresses. The RHR state controller 342 may use internal logic to provide the RHR signal. In some embodiments, the RHR state controller 342 may provide the RHR signal based on certain number of activations of AREF (e.g., every $4^{th}$ activation of AREF). The RHR state controller 342 may also provide an internal refresh signal IREF, which may indicate that an auto-refresh operation should take place. In some embodiments, the signals RHR and IREF may be generated such that they are not active at the same time (e.g., are not both at a high logic level at the same time).

The refresh address generator 350 may receive the row hammer refresh signal RHR and the match address HitXADD. The match address HitXADD may represent an aggressor row. The refresh address generator 350 may determine the locations of one or more victim rows based on the match address HitXADD and provide them as the refresh address RXADD. In some embodiments, the victim rows may include rows which are physically adjacent to the aggressor row (e.g., HitXADD+1 and HitXADD−1). In some embodiments, the victim rows may also include rows which are physically adjacent to the physically adjacent rows of the aggressor row (e.g., HitXADD+2 and HitXADD−2). Other relationships between victim rows and the identified aggressor rows may be used in other examples.

The refresh address generator 350 may determine the value of the refresh address RXADD based on the row hammer refresh signal RHR and the internal auto-refresh signal IREF. In some embodiments, when the signal IREF is active, the refresh address generator 350 may provide one of a sequence of auto refresh addresses. When the signal RHR is active, the refresh address generator 350 may provide a targeted refresh address, such as a victim address, as the refresh address RXADD.

The row decoder 308 may perform one or more operations on the memory array 318 based on the received signals and addresses. For example, responsive to the activation signal ACT and the row address XADD (and IREF and RHR being at a low logic level), the row decoder 308 may direct one or more access operations (for example, a read operation) on the specified row address XADD. Responsive to the RHR signal being active, the row decoder 308 may refresh the refresh address RXADD. In some embodiments, the counter 346 may increment the access count stored in the counter memory cells 326 responsive to a refresh operation of a given row. In some embodiments, the counter 346 may not increment the access count responsive to a refresh operation.

FIGS. 4-7 show various example layouts of memory cell arrays which include a 2T architecture region. Each of these layouts show a portion of a memory cell array including representative portions in a 1T region and in a 2T region, similar to the array 200 of FIG. 2. Each of the view of FIGS. 4-7 may show only a portion of a memory cell array, and the memory cell arrays may include greater or fewer memory cells, word lines, bit lines, etc. For example, each of the views of FIGS. 4-7 may show only a portion of the 2T region, and greater (or fewer) numbers of memory cells in the 2T region may be used. Since each of the FIGS. 4-7 may include many components which are broadly similar to each other, for the sake of brevity, certain details may be described only once. For example, the layout of a normal (e.g., 1T) region may only be described with respect to FIG.

4. However, it should be understood that the details of the normal region may apply to each of the other FIGS. 5-7 as well.

Similarly, it should be understood that variations described with respect to one embodiment may equally be applied to the other embodiments as well. For example, each of the FIGS. 4-8 shows a memory layout where each column select signal CS activates 8 sense amplifiers (or 4 in the 2T region), and two CS signals may be activated to read out 16 bits of data (or fewer bits if the 2T region is activated). However, the embodiments described with respect to FIGS. 4-8 may also have greater or fewer bits selected per CS signal.

Figure 4:
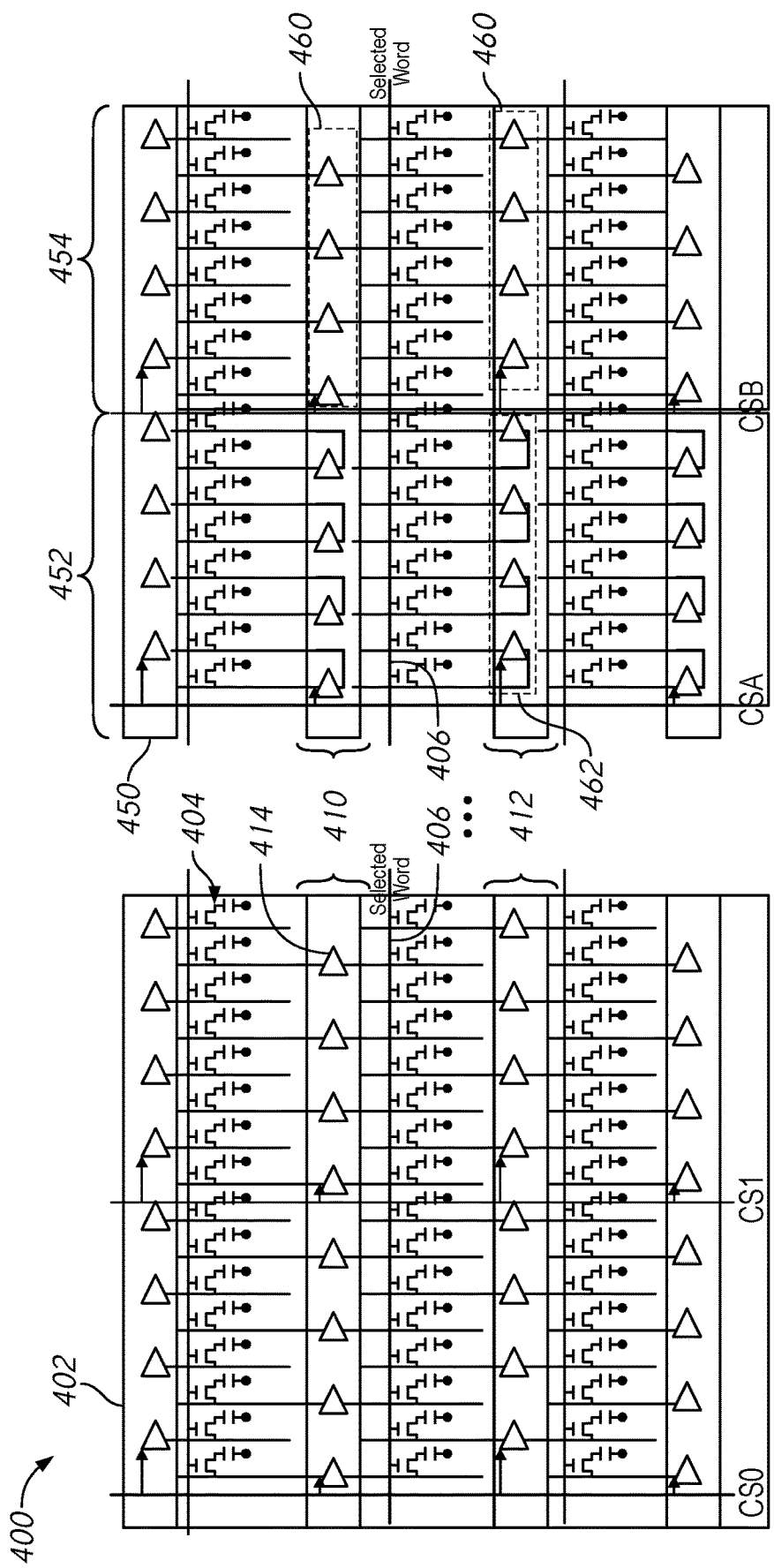
FIG. 4 is a schematic diagram of a memory array according to some embodiments of the present disclosure.

FIG. 4 is a schematic diagram of a memory array according to some embodiments of the present disclosure. The memory array 400 may, in some embodiments, but included in the memory array 118 of FIG. 1, and/or may be an implementation of the memory array 200 of FIG. 2.

The memory array 400 includes a normal region 402 and a 2T region 450. Word lines, such as example word line 406, may extend from the normal region 402 to the 2T region 450, and may be coupled to memory cells in both regions. In some embodiments, there may be a different number of memory cells in the normal region 402 than in the 2T region 450. For example, the normal region 402 may have many more memory cells than the 2T region 450. In some embodiments, 8, 16, 32 or greater or fewer memory cells may be in the 2T region 450.

In the embodiment of FIG. 4, the 2T region 450 includes both a 2T portion 452 and a 1T portion 454. Each portion 452 and 454 is activated by a respective column select signal CSA and CSB. In the 2T portion, each sense amplifier is coupled to two adjacent bit lines, and through those to two adjacent memory cells. Accordingly, when the signal CSA is active, four sense amplifiers are activated to read out 4 bits of information, from 4 pairs of bit lines (and four pairs of memory cells). If only the signal CSA is activated, then 4 bits are read out. If both CSA and CSB are activated, then 12 total bits are read out (e.g., as compared to 16 total bits if two CS signals were activated in the normal region 402).

The normal region 402 includes a number of memory cells 404. Each memory cell includes a capacitive element which stores a charge. The amount of stored charge indicates the logical value stored in the memory cell. A transistor with a gate coupled to the word line has nodes coupled to a bit line and to the capacitive element. Accordingly, when a word line is selected and activated, the voltage on the word line couples the capacitive element to the bit line, which changes the voltage along the bit line. For example, a higher voltage (e.g., more charge on the capacitive element) may indicate a logical high, while lower voltage may indicate a logical low.

The memory is laid out with sense amplifier regions 410 and 412. The sense amplifier regions include a set of sense amplifiers 414. In the normal memory region 402, each sense amplifier is coupled to a pair of bit lines, each of which is coupled to a memory cell along a different word line. For example, each sense amplifier may be coupled along a first and second bit line to a first and second word line, which are adjacent to each other. The column select signals may activate sense amplifiers in the two sense amplifier regions 410 and 412 which are coupled to bit lines which are coupled to memory cells along that word line. Those sense amplifiers in turn may be coupled to I/O lines.

During an example read operation in the normal region 402, the word line 406 may be activated, and the column select signals CS0 and CS1 may be provided. Each of the column select signals may activate four sense amplifiers in the sense amplifier region 410 and the sense amplifier region 412. Every other memory cell along the activated word line 406 is coupled to a sense amplifier in one of the regions 410 or 412. Each sense amplifier may be coupled to one memory cell which is active (e.g., along the active word line 410) and one which is not (e.g., along an adjacent, non-selected word line). The active memory cell provides a voltage which represents a stored logical value, while the bitline coupled to the non-active memory cell provides a reference voltage. The sense amplifier 414 may sense a difference between the voltage of the bit line coupled to the active memory cell compared to the reference voltage, and generate an output based on that sensed difference. Accordingly, by activating CS0, eight bits are read out from eight memory cells along the word line with the bits being alternately read by the sense amplifier region 410 and the sense amplifier region 412. Similarly eight more bits are read out by activating CS1, for a total of 16 bits read out.

The 2T region 450 may have components, such as memory cells 404 and sense amplifiers 414 which are broadly similar to the normal region 402. Similarly, the 2T region 450 may be laid out with sense amplifier regions 410 and 412. However, in the 2T region 450, specifically in the 2T portion 452, each sense amplifier 414 is coupled to two bit lines which are coupled to adjacent memory cells along the same word line. Accordingly, the two memory cells coupled to the sense amplifier may store the same information, since the two memory cells are coupled to the same word line. Accordingly, when the word line is activated (e.g., as part of a read or write operation) and the signal CSA is provided, the sense amplifiers each provide (or receive) information from two active memory cells at the same time.

The 2T portion 452 may use differential signal storing. The sense amplifier 414 may have a differential architecture with two inputs. However, unlike in the normal region 402 (or the 1T portion 454) where each sense amplifier is coupled to an active bit line and a reference bit line, each sense amplifier 414 in the ET portion 452 is coupled to two bit lines which are each coupled to memory cells which are both active. During an example write operation, the sense amplifiers 414 may receive a voltage representing a bit of information. The sense amplifier 414 drives a first bit line to a voltage representing the value of the bit, and the second bit line to a voltage representing the logical complement of the value of the bit. For example, if the sense amplifier receives a voltage representing a logical high, the first bit line is driven high and the second is driven low. The two active memory cells may then capture these values and store them. Accordingly, while the two memory cells may store a single bit of information, each memory cell may store a complimentary bit of information. This may increase the speed at which the sense amplifier is able to detect the stored bit, since rather than compare the read value to a reference value, the sense amplifier is comparing a 'true' voltage to its logical complement, which will be a greater voltage differential (e.g., since the reference voltage is roughly halfway between a logical high and logical low voltage).

During an example read operation, the word line 406 is activated. The signals CSA and CSB may be provided. In the 1T portion 454, as previously described with respect to the normal region 402, sense amplifiers in the SA regions 410 and 412 are activated and 8 bits are read out from the eight memory cells along the portion of the word line 406 in the 1T portion 454. The activated sense amplifiers are noted by box 460. In the 2T portion 452, the signal CSA activates sense amplifiers in both the 410 and 412 sense amplifier region, however, the sense amplifiers in the region 410 are not coupled to an active word line, and so their outputs are discarded as invalid. The sense amplifiers in the region 412 are each coupled to bit lines which are coupled to a respective adjacent pair of memory cells along the activated word line. Since these memory cells store a differential signal, one bit line will be charged with a 'true' value and the other with its logical complement, allowing the sense amplifier to read the value of the bit. Accordingly, four bits are read from the region 412 in the 2T portion 452, for a total of 12 bits.

Figure 5:
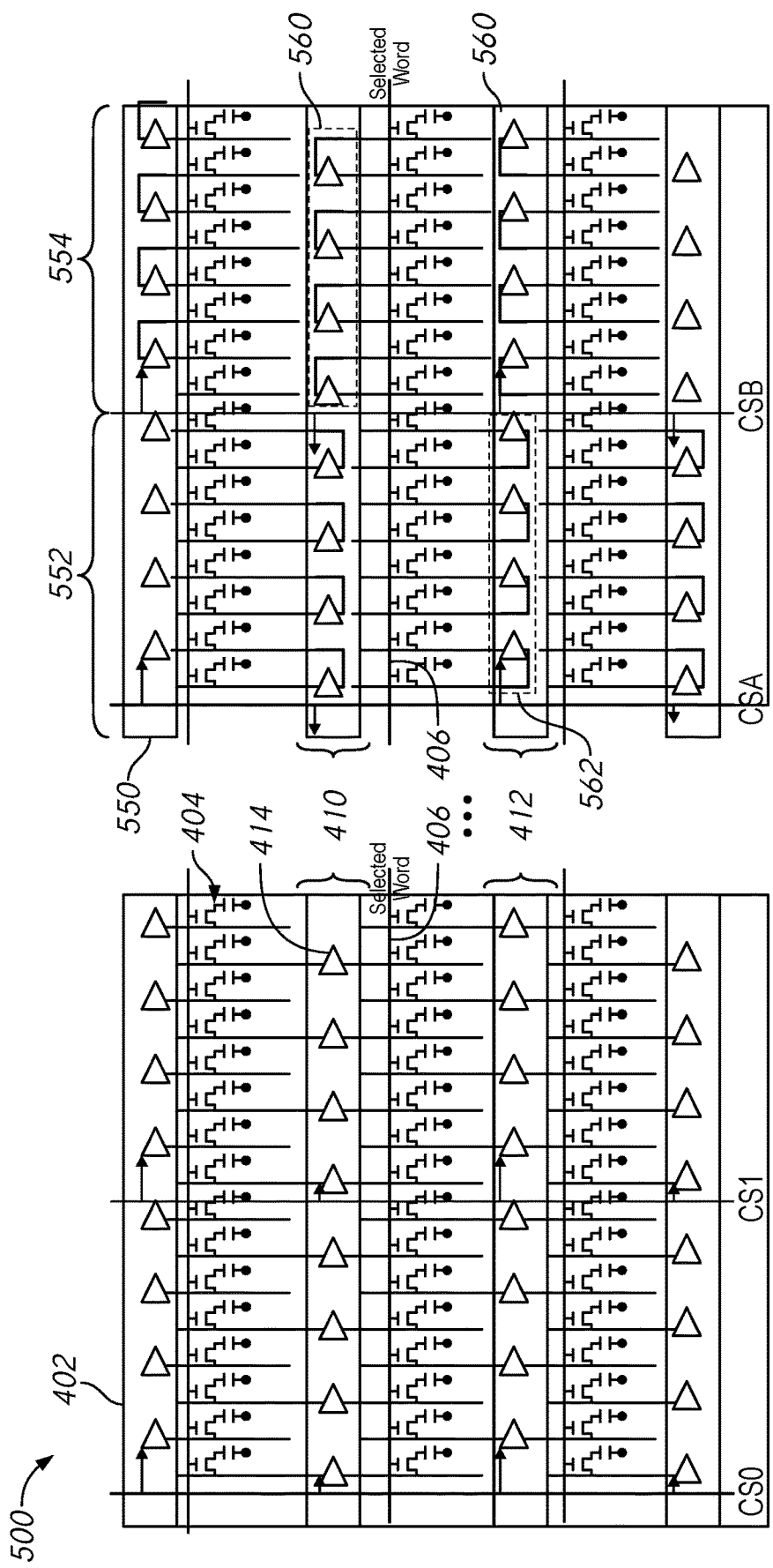
FIG. 5 is a schematic diagram of a memory array according to some embodiments of the present disclosure.

FIG. 5 is a schematic diagram of a memory array according to some embodiments of the present disclosure. The memory array 500 may, in some embodiments, but included in the memory array 118 of FIG. 1 and/or may be an implementation of the memory array 200 of FIG. 2.

The memory array 500 includes a 2T region 550 in which each sense amplifier is coupled to a pair of memory cells along the same word line, and in which the column select signals activate a single sense amplifier region in each section of the 2T portion 550. Accordingly, the 2T region 550 may store and read out 8 bits, four from each portion 552 and 554.

The memory array 500 includes a 1T region 402. The 1T region 402 may be broadly similar to the 1T region previously described with respect to FIG. 4, and so for the sake of brevity, features and components already described will not be described again. The example selected word line 406 may extend from the 1T region 402 into the 2T region 450, and may be coupled to memory cells in both regions.

Similar to the 2T portion 452 of the 2T region 450 of FIG. 4, in the 2T region 550, each sense amplifier is coupled to a pair of adjacent bit lines, which are coupled to adjacent memory cells along a single word line. Accordingly, the paired memory cells store a differential signal. Since the 2T region 550 includes multiple 2T portions (e.g., as opposed to the region 450 of FIG. 4), each portion may alternate which word line the sense amplifier regions are coupled to. For example, in a first portion 552, the sense amplifier regions may be coupled to memory cells along a word line which is shown above that sense amplifier region, while in a second portion 554, the sense amplifier regions may be coupled to memory cells along a word line which is shown below that sense amplifier region. In other words, example word line 406 is coupled to sense amplifiers in the region 412 in portion 552 (but not to sense amplifiers in the region 410) and to sense amplifiers in the region 510 in portion 554 (but not to sense amplifiers in the region 412).

In contrast to the 2T region 450 of FIG. 4, in the 2T region 550 of FIG. 5, the column select signals alternate between activating sense amplifier regions in a first portion 552 and second portion 554. This may cause a single CS signal to activate every other sense amplifier region. For example, the signal CSA may activate the sense amplifiers of sense amplifier region 412 in portion 552, but not the sense amplifier region 410. Similarly, the signal CSB may activate the sense amplifier region 410 in the portion 552, but not the region 410 in the portion 554, and may activate the region 412 in the portion 554, and so forth, alternating word line by word line.

During an example read operation, a word line 406 may be activated, and every other column select signal CS may be activated in the 2T region 550. For example, the column select signals CSA and a signal CSC (not shown) may be activated. This may activate, for example the regions shown in boxes 560 and 562. Accordingly, a total of 8 bits (four from each of the regions 552 and 554) may be read out.

Figure 6:
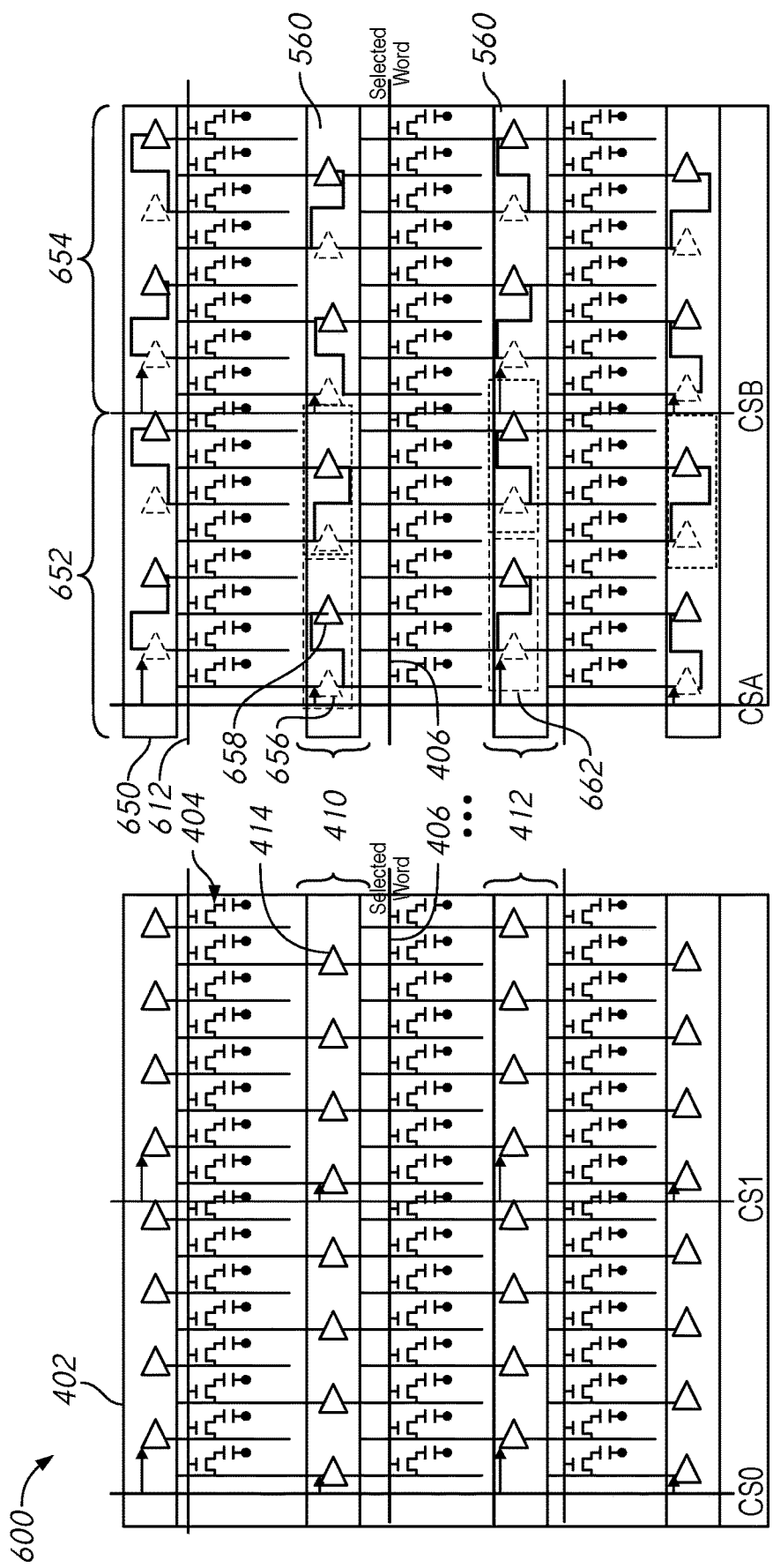
FIG. 6 is a schematic diagram of a memory array according to some embodiments of the present disclosure.

FIG. 6 is a schematic diagram of a memory array according to some embodiments of the present disclosure. The memory array 500 may, in some embodiments, but included in the memory array 118 of FIG. 1 and/or may be an implementation of the memory array 200 of FIG. 2.

The memory array 600 includes a 1T region 402. The 1T region 402 may be broadly similar to the 1T region previously described with respect to FIG. 4, and so for the sake of brevity, features and components already described will not be described again. The example selected word line 406 may extend from the 1T region 402 into the 2T region 450, and may be coupled to memory cells in both regions.

The memory array 600 includes a 2T region 650 in which each sense amplifier is coupled to two non-adjacent bit lines which intersect (non-adjacent) memory cells along a same word line. Similar to the 2T region 550 of FIG. 5, in the 2T region 650 of FIG. 6, each column select signal activates four sense amplifiers each coupled to two memory cells, for a total of four bits stored in a differential fashion in eight memory cells. However, in the memory array 600, a different layout is used, which utilizes both sense amplifier regions 410 and 412 in each portion 652 and 654.

Taking as an example the sense amplifier region 410, a first sense amplifier 656 is coupled to a memory cell coupled to the word line 610 and to a memory cell along the adjacent word line 612. The sense amplifier 656, and others like it, are shown in dotted lines to indicate that it is not used (e.g., it may not be coupled to a I/O line and/or signals along its I/O line may be ignored). In some embodiments, the dotted line sense amplifiers may be still be used (e.g., to act in tandem and increase speed of operation) but the dotted line amplifiers may not have separate outputs.

Adjacent to the sense amplifier 656 is the sense amplifier 658. The sense amplifier 658 has a first input coupled to a memory cell along the word line 406, which is the same as the memory cell coupled to the amplifier 656. The sense amplifier 658 also has a second input coupled to a memory cell which is not-adjacent to the memory cell coupled to the first input. For example, the two memory cells coupled to sense amplifier 658 may be separated by a memory cell which is coupled to a sense amplifier in the sense amplifier region 412.

Accordingly, during an example read operation, the column select signal CSA may be activated, and the sense amplifier regions 410 and 412 are activated. In each region, two out of the four sense amplifiers are activated (e.g., 658) and coupled to an I/O line, for a total of 4 bits stored in a differential fashion in the eight memory cells in portion 652.

Figure 7:
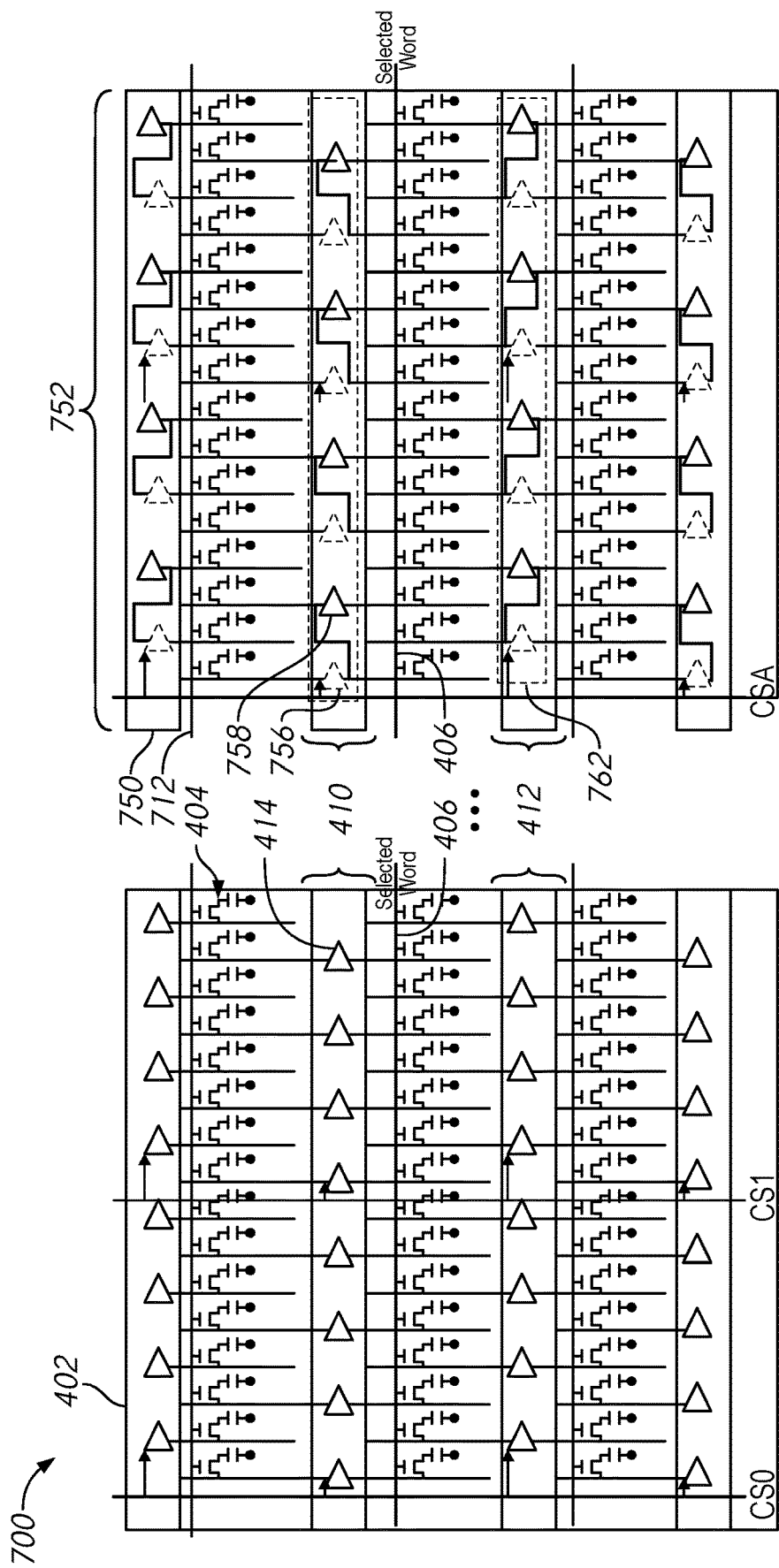
FIG. 7 is a schematic diagram of a memory array according to some embodiments of the present disclosure.

FIG. 7 is a schematic diagram of a memory array according to some embodiments of the present disclosure. The memory array 500 may, in some embodiments, but included in the memory array 118 of FIG. 1 and/or may be an implementation of the memory array 200 of FIG. 2.

The memory array 600 includes a 1T region 402. The 1T region 402 may be broadly similar to the 1T region previously described with respect to FIG. 4, and so for the sake of brevity, features and components already described will not be described again. The example selected word line 406 may extend from the 1T region 402 into the 2T region 450, and may be coupled to memory cells in both regions.

The memory array 700 may be generally similar to the memory array 600 of FIG. 6, however in the memory array 700, in the 2T region 750 each column select signal activates sense amplifiers corresponding to 8 bits of information, the same as each column select signal in the normal region 402. Accordingly, each column select signal in the 2T portion 752 may activate 8 sense amplifiers in each sense amplifier region (e.g., 410 and 412), four of which are coupled to I/O lines, for a total of four bits from each SA region per activated CS signal and activated word line. Thus, each activated CS signal in the 2T portion 752 provides the same number of bits of information as each activated CS signal in the normal portion 402.

Figure 8A:
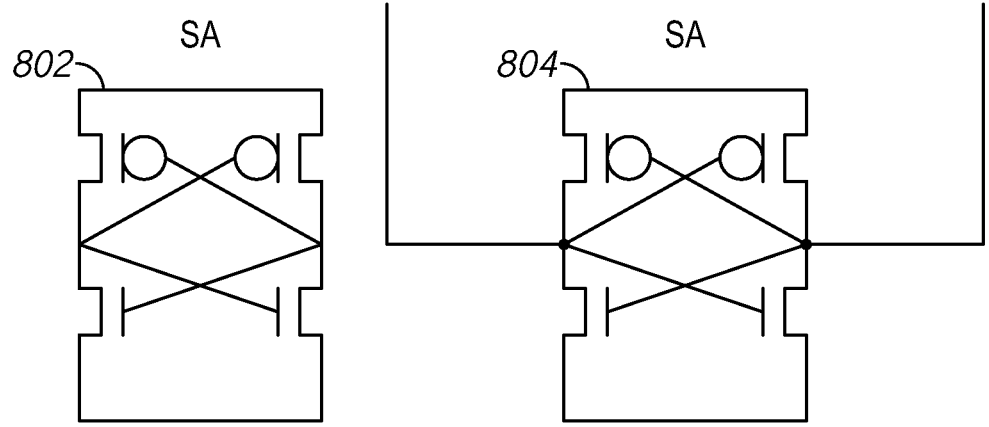
FIGS. 8A-8B are example layouts of sense amplifiers according to some embodiments of the present disclosure.
Figure 8B:
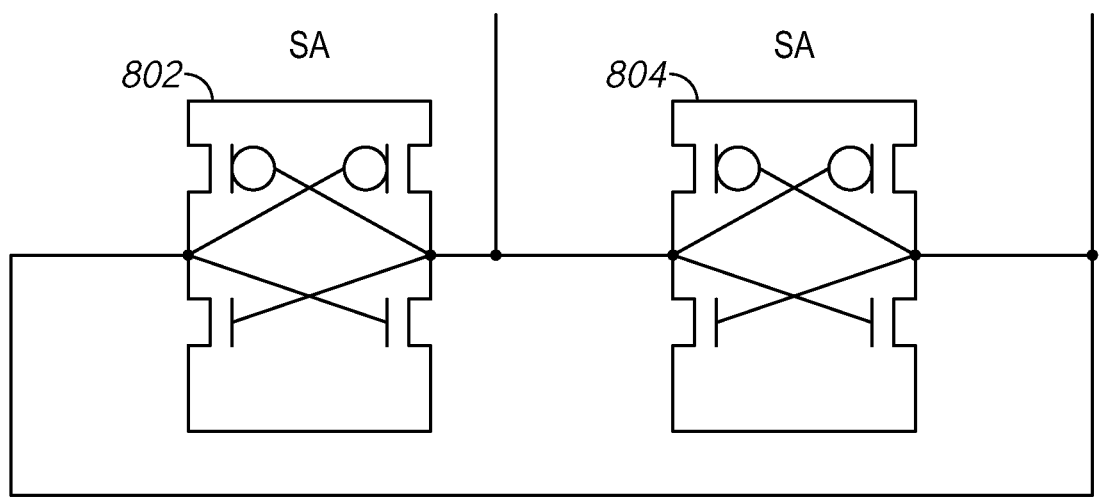

FIGS. 8A-8B are example layouts of sense amplifiers according to some embodiments of the present disclosure. The sense amplifiers 802 and 804 represent example sense amplifiers which may be used as the sense amplifiers 232 of FIG. 2, 414 of FIGS. 4-7, 656 and 658 of FIG. 6 and/or 756 and 758 of FIG. 7. In particular, FIGS. 8A and 8B show example layouts which may be used to couple sense amplifiers to memory cells in embodiments, such as those of FIGS. 6 and 7, where each pair of sense amplifiers in a sense amplifier region is used to sense data from a pair of memory cells.

Each sense amplifier may include a pair of cross coupled inverters, with the input of each inverter acting as one of the inputs of the sense amplifier. Each sense amplifier includes two pairs of a p-type and n-type transistor, coupled between a high and low voltage (e.g., VDD and VSS) representing high and low logical levels. The nodes between each pair are coupled to the gates of the other pair. Each node acts as one of the inputs of the sense amplifier, and one node is also coupled to an IO line (e.g., via a transistor acting as a switch, which may be activated by a CS signal).

FIG. 8A shows sense amplifiers 802 and 804 which may respectively implement the transistors 656 and 658 of FIG. 6 and/or 756 and 758 of FIG. 7. In this embodiment, the sense amplifier 802 is left uncoupled, while the sense amplifier 804 couples to a pair of memory cells.

FIG. 8B shows sense amplifiers 802 and 804 which may respectively implement the transistors 656 and 658 of FIG. 6 and/or 756 and 758 of FIG. 7. In this embodiment, both sense amplifiers are coupled together and both are active to sense and amplify voltages to and from the memory cells. A first input of the sense amplifier 802 is coupled to a second input of the sense amplifier 804 and to a first bit line, while a second input of the sense amplifier 802 is coupled to a first input of the sense amplifier 804 and to a second bit line.

Figures 9A, 9B:
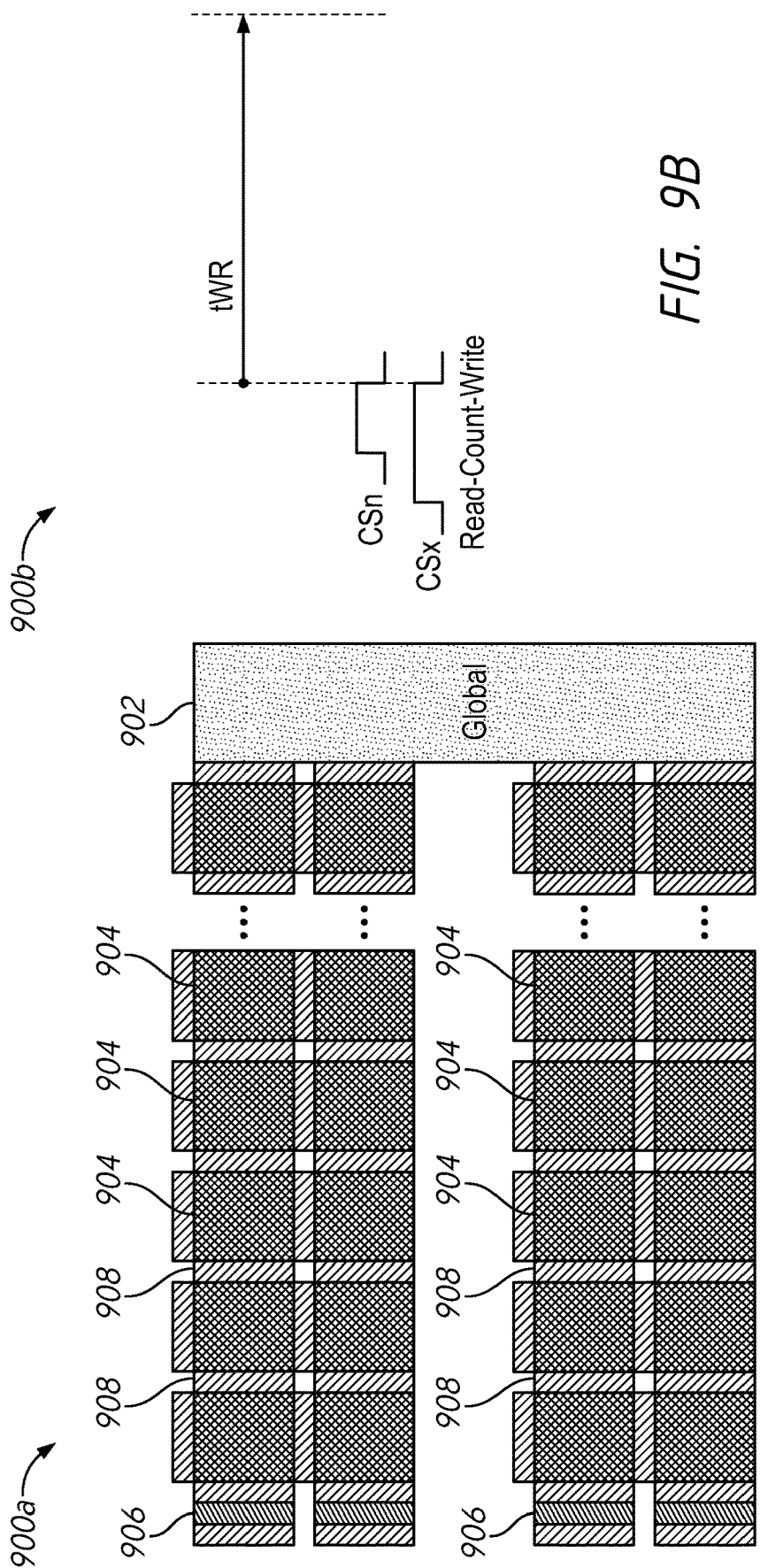
FIGS. 9A and 9B are an example layout of a memory array and example timing diagram according to some embodiments of the present disclosure.

FIGS. 9A and 9B are an example layout of a memory array and example timing diagram according to some embodiments of the present disclosure. The memory array 900a may, in some embodiments, be an implementation of the memory array 100 of FIG. 1 and/or 400 of FIG. 4. The timing diagram 900b represents an example timing of operations in the memory array 900a.

The memory array 900a is organized into a number of memory mats 904, each of which includes a number of word lines and bit lines. Each memory mat 904 has associated logic organized in regions 908 between the regions 904. For example, the sense amplifiers may be located in the logic regions 908. A global logic region 902 includes various circuits such as global input/output circuits coupled to the memory mats 904.

In the memory array 900a, the memory mats 904 may only include 1T memory cell architecture (e.g., the memory mats 904 may represent normal region 402 of FIGS. 4-7). Meanwhile, additional memory mats 906 only includes the 2T memory cell architecture. Accordingly, the 2T memory cells in the additional memory mats 906 may be activated separately from the 1T memory cells in the other memory mats 904. In some embodiments, the additional memory mats 906 may be located at an end of the word line. In other embodiments, the additional memory mats 906 may be located in other locations.

The timing diagram 900b shows example timing of an access operation. The waveform CSn represents the time a column select signal in a normal memory mat 904 (e.g., CS0 or CS1 in FIGS. 4-7). The waveform CSx represents the activation of a bit line (e.g., CSA or CSB of FIGS. 4-7) which is in the additional memory mat 906. Since the memory cells in the mats 904 and additional mats 908 may be operated separately, access operations, such as read and write may be performed in parallel in the memory mats 904 and 908.

For example, if the memory cells in the additional mat 908 are used to store a count value, then the column signals CSx may need to be active long enough for a read operation, changing the count value, and then a write operation. As may be seen from the timing diagram 900b, since the memory cells can be accessed in parallel, the column signals CSx may be activated ahead of the normal region signals CSn. This may allow the column signals CSn and CSx to become inactive at roughly the same time, which allows a time tWR, defined in the specification, to elapse before access operations may be performed again.

Figure 10B:
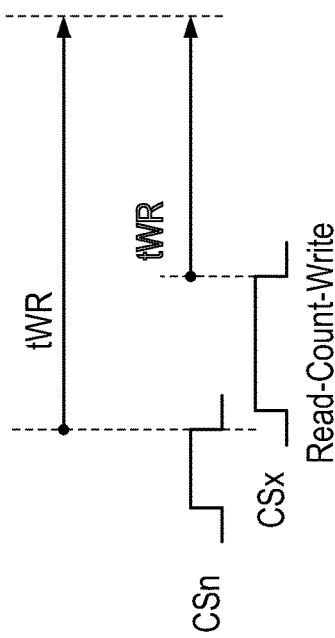
FIGS. 10A and 10B are an example layout of a memory array and example timing diagram according to some embodiments of the present disclosure.
Figure 10A:
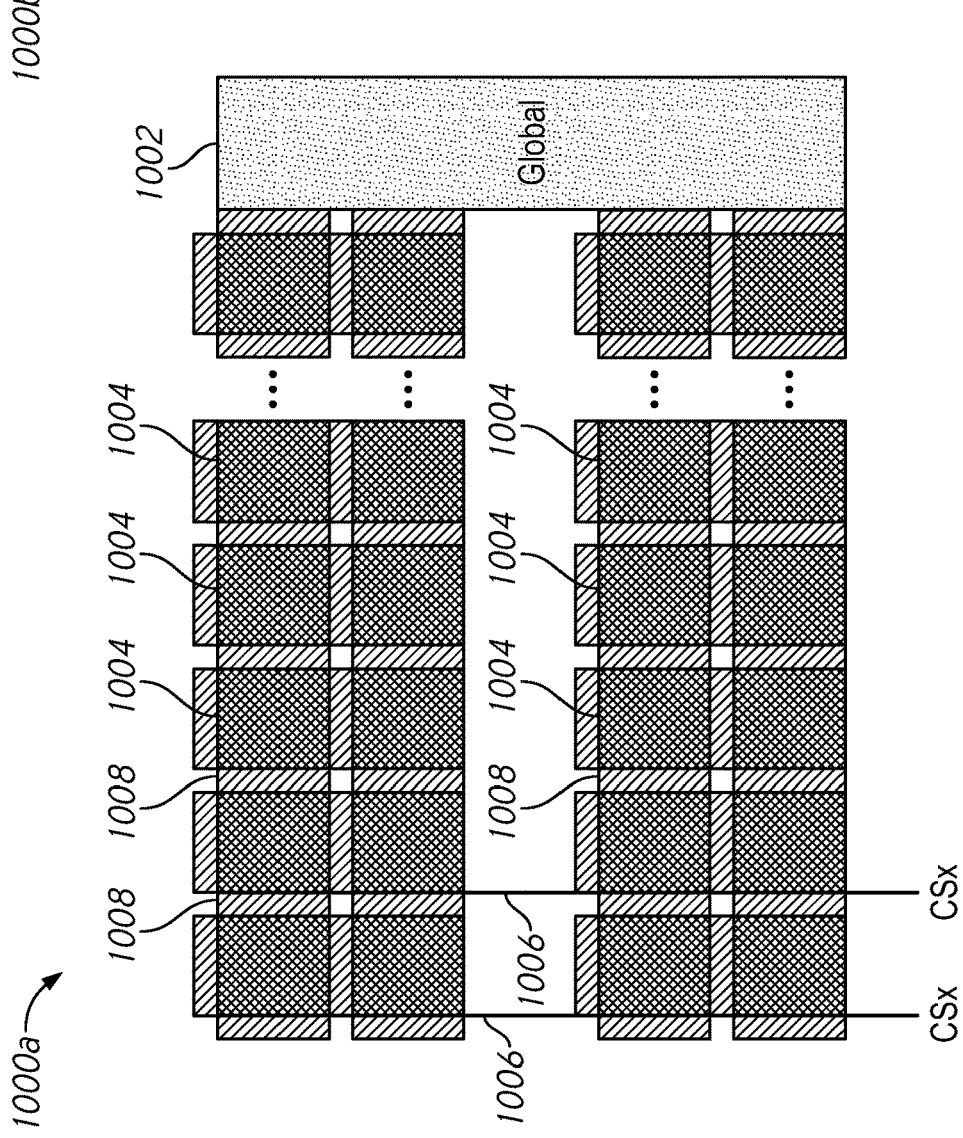

FIGS. 10A and 10B are an example layout of a memory array and example timing diagram according to some embodiments of the present disclosure. The memory array 1000a may, in some embodiments, be an implementation of the memory array 100 of FIG. 1 and/or 400 of FIG. 4. The timing diagram 1000b represents an example timing of operations in the memory array 1000a. Since FIGS. 10A and 10B are broadly similar to FIGS. 9A and 9B respectively, for the sake of brevity descriptions of components and operations similar to those described with respect to FIGS. 9A and 9B will not be repeated with respect to FIGS. 10A-10B.

The memory array 1000a is organized into a number of memory mats 1004, each of which includes a number of word lines and bit lines. Each memory mat 1004 has associated logic organized in regions 1008 between the regions 1004. For example, the sense amplifiers may be located in the logic regions 1008. A global logic region 1002 includes various circuits such as global input/output circuits coupled to the memory mats 1004.

The memory array 1000a includes sense amplifiers in a 2T region activated by column select signals 1006, here represented generically as CSx (e.g, CSA or CSB of FIGS. 4-7) which are positioned in mats 1004, which also include sense amplifiers coupled in a 1T fashion, and operated by other column select signals (e.g., CS0 or CS1 of FIGS. 4-7) not shown in the view of FIG. 10A. Accordingly, each memory mat 1004 may include both 1T and 2T architecture. In embodiments where the 2T memory cells are used to store a count value, the count value may be spread across multiple mats 1004.

The timing diagram 1000b shows that the normal column select signal CSn and 2T column select signal CSx are provided sequentially. Accordingly, the signal CSx may become active when the signal CSn becomes inactive. However, the 2T memory cells accessed while the signal CSx is active may require a shorter time to recover after an access operation. Thus, the accessing of the CSx and the tWR required for the CSx sense amplifiers may be equal to or less than the tWR required for the CSn access operations. Accordingly, accessing the 2T memory cells may not increase the overall time for an access operation.

In some embodiments of the disclosure, a targeted refresh on one or more victim wordlines associated with the accessed wordline may be performed based on comparing the access count to the threshold. For example, if the access count is greater than the threshold, then the accessed wordline may be identified as an aggressor wordline. An address associated with the accessed wordline may be latched (e.g., in aggressor address register 344 of FIG. 3 or 444 of FIG. 4) responsive to the access count of the accessed wordline being greater than the threshold. A refresh address control circuit (e.g., refresh address control circuit 116 of FIG. 1 or 316 of FIG. 3) may indicate that a targeted refresh operation should be performed, with timing based off an auto-refresh signal of the memory. When performing a targeted refresh operation, the refresh address control circuit may calculate addresses associated with one or more victim wordlines associated with an aggressor address retrieved from the latch. In some embodiments, these victim rows may be adjacent to the accessed wordline. The victim wordlines may then be refreshed. In this manner, a memory device may count accesses to the wordlines of the memory device, may identify certain wordlines as aggressor wordlines based on the access counts, and may perform targeted refreshes of victim wordlines associated with the identified aggressor wordlines.

It is to be appreciated that any one of the examples, embodiments or processes described herein may be combined with one or more other examples, embodiments and/or processes or be separated and/or performed amongst separate devices or device portions in accordance with the present systems, devices and methods.

Finally, the above-discussion is intended to be merely illustrative of the present system and should not be construed as limiting the appended claims to any particular embodiment or group of embodiments. Thus, while the present system has been described in particular detail with reference to exemplary embodiments, it should also be appreciated that numerous modifications and alternative embodiments may be devised by those having ordinary skill in the art without departing from the broader and intended spirit and scope of the present system as set forth in the claims that follow. Accordingly, the specification and drawings are to be regarded in an illustrative manner and are not intended to limit the scope of the appended claims.

What is claimed is:

1. An apparatus comprising:
   a word line coupled to a first memory cell, a second memory cell, and a third memory cell;
   a first sense amplifier coupled to the first memory cell;
   a second sense amplifier coupled to the second memory cell and the third memory cell; and
   a counter circuit coupled to the second sense amplifier, wherein the counter circuit is configured to adjust a count value stored, in part, in the second and the third memory cell based on accesses to the word line.

2. The apparatus of claim 1, further comprising a refresh control circuit configured to store an address associated with the word line as an aggressor address based on the count value exceeding a threshold.

3. The apparatus of claim 1, wherein the second memory cell and the third memory cell are adjacent to each other.

4. The apparatus of claim 1, wherein the second memory cell and the third memory cell are not adjacent to each other.

5. The apparatus of claim 1, further comprising a third sense amplifier coupled to the second memory cell and the third memory cell.

6. An apparatus comprising:
   a word line coupled to a first memory cell, a second memory cell, a third memory cell, a fourth memory cell, and a fifth memory cell;
   a first sense amplifier coupled to the first memory cell;
   a second sense amplifier coupled to the second memory cell and the third memory cell; and
   a third sense amplifier coupled to the fourth memory cell and the fifth memory cell,
   wherein the second sense amplifier is in a first sense amplifier region and the third sense amplifier is in a second sense amplifier region.

7. The apparatus of claim 1, wherein the second sense amplifier includes a first input coupled to the second memory cell and a second input coupled to the third memory cell.

8. An apparatus comprising:
   a word line coupled to a plurality of memory cells, including a first plurality of memory cells and a second plurality of memory cells, wherein the second plurality of memory cells is configured to store a count value associated with a number of accesses to the word line; and
   a plurality of sense amplifiers, including a first plurality of sense amplifiers, and a second plurality of sense amplifiers,
   wherein each of the first plurality of sense amplifiers is coupled to one of the first plurality of memory cells, and wherein each of the second plurality of sense amplifiers is coupled to two of the second plurality of memory cells.

9. The apparatus of claim 8, wherein each of the second plurality of sense amplifiers is configured to sense a bit in a differential fashion in the two of the second plurality of memory cells.

10. The apparatus of claim 8, wherein each of the second plurality of sense amplifiers is coupled to two non-adjacent ones of the second plurality of memory cells.

11. The apparatus of claim 8, wherein the second plurality of memory cells are located in a different mat than the first plurality of memory cells.

12. The apparatus of claim 8, wherein the second plurality of memory cells are located in a same mat as the first plurality of memory cells.

13. An apparatus comprising:
   a word line coupled to a plurality of memory cells;
   a first sense amplifier section including a first plurality of sense amplifiers;
   a second sense amplifier section including a second plurality of sense amplifiers;
   a first portion of the first and the second plurality of sense amplifiers configured to be activated by a first column select signal, wherein each of the first portion of the first and the second plurality of sense amplifiers are coupled to one of the plurality of memory cells coupled to the word line; and
   a second portion of the first plurality of sense amplifiers configured to be activated by a second column select signal, wherein each of the second portion of the first plurality of sense amplifiers is coupled to more than one of the plurality of memory cells coupled to the word line.

14. The apparatus of claim 13, wherein the first portion of the first and the second plurality of sense amplifiers are configured to provide a first number of bits responsive to the first column select signal, wherein the second portion of the first plurality of sense amplifiers are configured to provide a second number of bits responsive to the first column select signal, and wherein the second number is less than the first number.

15. The apparatus of claim 13, wherein the first portion of the first and the second plurality of sense amplifiers are configured to provide a first number of bits responsive to the first column select signal, wherein the second portion of the first plurality of sense amplifiers are configured to provide a second number of bits responsive to the first column select signal, and wherein the second number is the same as the first number.

16. The apparatus of claim 13, wherein a second portion of the second plurality of sense amplifiers is configured to be activated by a third column select signal, and wherein the second portion of the second plurality of sense amplifiers are each coupled to more than one memory cell along a second word line.

17. The apparatus of claim 13, wherein the second portion of the first plurality of plurality of sense amplifiers further includes additional sense amplifiers which are not activated by the second column select signal.

18. The apparatus of claim 13, wherein the each of the second portion of the first plurality of sense amplifiers is configured to store a bit in a differential fashion in a first of the plurality of memory cells and a second of the plurality of memory cells.

* * * * *